(12) United States Patent
Dent (10) Patent No.: US 7,612,552 B2
(45) Date of Patent: Nov. 3, 2009

(54) ELECTRICAL PHASE CHECKING APPARATUS AND METHOD OF METERING

(76) Inventor: Christopher L. Dent, 64 NW. Franklin Ave., Bend, OR (US) 97701

( * ) Notice: Subject to any disclaimer, the term of this patent is extended or adjusted under 35 U.S.C. 154(b) by 247 days.

(21) Appl. No.: 11/888,765

(22) Filed: Aug. 1, 2007

(65) Prior Publication Data
US 2008/0036446 A1    Feb. 14, 2008

(51) Int. Cl.
*G01R 19/00* (2006.01)
(52) U.S. Cl. .................................... 324/86; 324/142
(58) Field of Classification Search ............... 324/86, 324/142; 702/61
See application file for complete search history.

(56) References Cited
U.S. PATENT DOCUMENTS

| 6,397,155 | B1 * | 5/2002 | Przydatek et al. | 702/61 |
| 2004/0021452 | A1 * | 2/2004 | Hwang et al. | 324/66 |
| 2007/0200552 | A1 * | 8/2007 | Fritz | 324/142 |

OTHER PUBLICATIONS

Description of Veris Industries H8035/8036 Series (located at www.veris.com/file_uploads/h8035-3b_d.pdf).
Description of Summit Technology SureStart (tm) (located at www.summittechnology.com/surestart.shtml).

* cited by examiner

*Primary Examiner*—Vincent Q Nguyen
(74) *Attorney, Agent, or Firm*—Andrew F. Knight (57) ABSTRACT

An electrical phase checking apparatus includes a first voltage sensor, a first current sensor, a first binary indicator corresponding to the first voltage and current sensors, a second voltage sensor, a second current sensor, and a second binary indicator corresponding to the second voltage and current sensors. The first binary indicator is configured to indicate when a phase separation between a voltage waveform measured by the first voltage sensor and a current waveform measured by the first current sensor is not more than a first value, and the second binary indicator is configured to indicate when a phase separation between a voltage waveform measured by the second voltage sensor and a current waveform measured by the second current sensor is not more than a second value.

18 Claims, 6 Drawing Sheets

ELECTRICAL PHASE CHECKING APPARATUS AND METHOD OF METERING

BACKGROUND

There is a growing interest in electrical energy metering in support of energy efficiency and conservation as well as bill reduction. Electrical power meters for both temporary and permanent installations have been used. Electrical power measurement often requires simultaneous measurement of both voltage and current (often using a sensor called a current transformer ("CT") as a sensor) on one, two, or three electrical phases. Inside the meter the voltage is multiplied by the current (from the CT) to calculate watts, kilowatt-hours, and other electrical parameters.

For two-phase and three-phase systems to be metered correctly, the phase of the wire the current sensor is placed on must match or correspond to the phase of the voltage that is measured and multiplied by the current to calculate watts.

For a typical commercial or industrial electrical service, there are three phases: L1, L2, and L3 (though different designators can also be used). When metering a three-phase service the meter will be connected to the three phase wires and a CT placed around each phase wire as well. Correct measurement requires that the L1 current measured by the CT placed on the L1 phase wire be internally (to the meter) multiplied by the L1 voltage measured by the voltage measured on the L1 phase wire. The same is true for the L2 & L3 phases. A three-phase system usually includes four wires: one wire for each phase and a neutral wire. Measuring the relative voltages requires four voltage probes, connected to each wire, while measuring currents requires only three current probes, one connected to each of the three "hot" wires. For delta loads, the system does not include a neutral wire, whereby power is transferred via the "delta" (or relative difference) between each of the three phases. (Both 3 wire and 4 wire systems usually have a ground wire that is for electrical safety but is not part of the measurement circuit.)

SUMMARY OF THE INVENTION

One problem with current solutions is that the CTs are typically placed on the wires (of the device to be metered) at different locations than where the voltage reference leads are connected. This makes it difficult to ensure that proper "phasing" of the CTs (with respect to the corresponding voltage measurements) is being maintained. For example, when wiring a meter it is common to connect the L1 phase CT onto the L2 voltage wire and the L2 phase CT onto the L1 voltage wire. In this example the L3 phase CT is correctly placed on the L3 voltage lead. Another common mis-wire is to "rotate" the phases such that the L1 phase CT is on the L2 voltage wire, the L2 phase CT is on the L3 voltage wire and the L3 phase CT is on the L1 voltage wire. Many other combinations of mis-wiring are also possible.

A mis-wired meter can be insidious in the sense that it will still measure and record power and energy information—it will just be wrong. Sometimes it takes days or longer for someone reviewing the data from the meter to surmise the data is incorrect and send another crew to check and rewire the meter, resulting in higher labor costs and lost data (which may be used for revenue purposes of billing a tenant).

There is a need for an electrical meter that easily, inexpensively, and quickly indicates to a user when the sensors sensing characteristics of an electrical system have been improperly wired or connected. The present invention aims to solve one or more of these and other problems.

According to one embodiment of the present invention, an electrical phase checking apparatus comprises a first voltage sensor; a first current sensor; a first binary indicator corresponding to the first voltage and current sensors, the first binary indicator configured to indicate when a phase separation between a voltage waveform measured by the first voltage sensor and a current waveform measured by the first current sensor is not more than a first value; a second voltage sensor; a second current sensor; and a second binary indicator corresponding to the second voltage and current sensors, the second binary indicator configured to indicate when a phase separation between a voltage waveform measured by the second voltage sensor and a current waveform measured by the second current sensor is not more than a second value. The apparatus may further comprise a third voltage sensor; a third current sensor; and a third binary indicator corresponding to the third voltage and current sensors, the third binary indicator configured to indicate when a phase separation between a voltage waveform measured by the third voltage sensor and a current waveform measured by the third current sensor is not more than a third value.

In one aspect, the first, second, and third values are not more than 60°, and at least one of the first, second, and third binary indicators comprises at least one of a light and a sound-producing device. In one aspect, the first, second, and third binary indicators each comprises a red light-emitting diode and a green light-emitting diode. In one aspect, the first and second values are not more than 60°. In one aspect, at least one of the first and second binary indicators comprises a light.

According to one embodiment of the present invention, a method of metering an electrical characteristic of a system comprises in the following order: a) providing the electrical phase checking apparatus as described, wherein the apparatus further comprises a first voltage probe connected to the first voltage sensor, a first current probe connected to the first current sensor, a second voltage probe connected to the second voltage sensor, and a second current probe connected to the second current sensor; b) attaching at least two of the probes to at least one wire in the system; c) reading a binary indication output by at least one of the binary indicators; d) detaching at least one of the at least two of the probes and attaching it to a different wire in the system in response to the reading. The electrical phase checking apparatus may further comprise: a third voltage sensor; a third voltage probe connected to the third voltage sensor; a third current sensor; a third current probe connected to the third current sensor; and a third binary indicator corresponding to the third voltage and current sensors, the third binary indicator configured to indicate when a phase separation between a voltage waveform measured by the third voltage sensor and a current waveform measured by the third current sensor is not more than a third value. In one aspect, the first and second values are not more than 60°. In one aspect, the reading comprises viewing a binary light output.

According to one embodiment of the present invention, an electrical phase checking apparatus comprises: a first voltage sensor; a first current sensor; a first processor configured to determine a first power factor based at least in part on a voltage waveform measured by the first voltage sensor and a current waveform measured by the first current sensor; a first binary indicator corresponding to the first processor and configured to indicate when the first power factor is not less than a first value; a second voltage sensor; a second current sensor; a second processor configured to determine a second power factor based at least in part on a voltage waveform measured by the second voltage sensor and a current waveform measured by the second current sensor; and a second binary indicator corresponding to the second processor and configured to indicate when the second power factor is not less than a second value. The electrical phase checking apparatus may further comprise: a third voltage sensor; a third current sensor; a third processor configured to determine a third power factor based at least in part on a voltage waveform measured by the third voltage sensor and a current waveform measured by the third current sensor; and a third binary indicator corresponding to the third processor and configured to indicate when the third power factor is not less than a third value.

In one aspect, the first, second, and third values are not less than 0.5, and at least one of the first, second, and third binary indicators comprises at least one of a light and a sound-producing device. In one aspect, the first, second, and third binary indicators each comprises a red light-emitting diode and a green light-emitting diode. In one aspect, the first and second values are not less than 0.5. In one aspect, at least one of the first and second binary indicators comprises a light.

According to one embodiment of the present invention, a method of metering an electrical characteristic of a system comprises in the following order: a) providing the electrical phase checking apparatus as claimed in claim 11, wherein the apparatus further comprises a first voltage probe connected to the first voltage sensor, a first current probe connected to the first current sensor, a second voltage probe connected to the second voltage sensor, and a second current probe connected to the second current sensor; b) attaching at least two of the probes to at least one wire in the system; c) reading a binary indication output by at least one of the binary indicators; and d) detaching at least one of the at least two of the probes and attaching it to a different wire in the system in response to the reading. The electrical phase checking apparatus may further comprise: a third voltage sensor; a third voltage probe connected to the third voltage sensor; a third current sensor; a third current probe connected to the third current sensor; a third processor configured to determine a third power factor based at least in part on a voltage waveform measured by the third voltage sensor and a current waveform measured by the third current sensor; and a third binary indicator corresponding to the third processor and configured to indicate when the third power factor is not less than a third value. In one aspect, the first and second values are not less than 0.5. In one aspect, the reading comprises viewing a binary light output.

DETAILED DESCRIPTION

In the following description, the use of "a," "an," or "the" can refer to the plural. All examples given are for clarification only, and are not intended to limit the scope of the invention.

In one embodiment, this invention proposes the use of a testing algorithm built within the electrical meter together with six light emitting diodes (LEDs) in the form of three pairs of one red and one green LED. Each pair of LEDs may represent one of the phases and may light to indicate whether or not the CT phase matches the voltage phase for each of the three phases. In one embodiment, a green LED indicates correct matching, while a red LED indicates an error. The methodology can also be use on two-phase voltage systems (e.g., with only two bi-color LEDs) or on a three-phase, three-wire Delta service (typical for electric motors) which also requires only two CTs (even though there are three phases).

Several advantages of the present invention will be discussed below, with the understanding that this is not an exhaustive list. One advantage of the present invention is that it may save electrical contractors a great deal of time while installing electrical meters by providing a very simple way to verify that they have installed the meter correctly. It may also allow a less sophisticated installer (electrician without a metering theory background) to install meters quickly and correctly. Finally, it may provide the user of the metered data confidence that the data he is receiving from the meter (often remotely) is correct and not corrupted by a faulty meter installation. The invention is not limited to LED indicators, and may include any kind of indicators, including but not limited to liquid crystal displays (LCDs), lights, and so forth.

Figure 3:
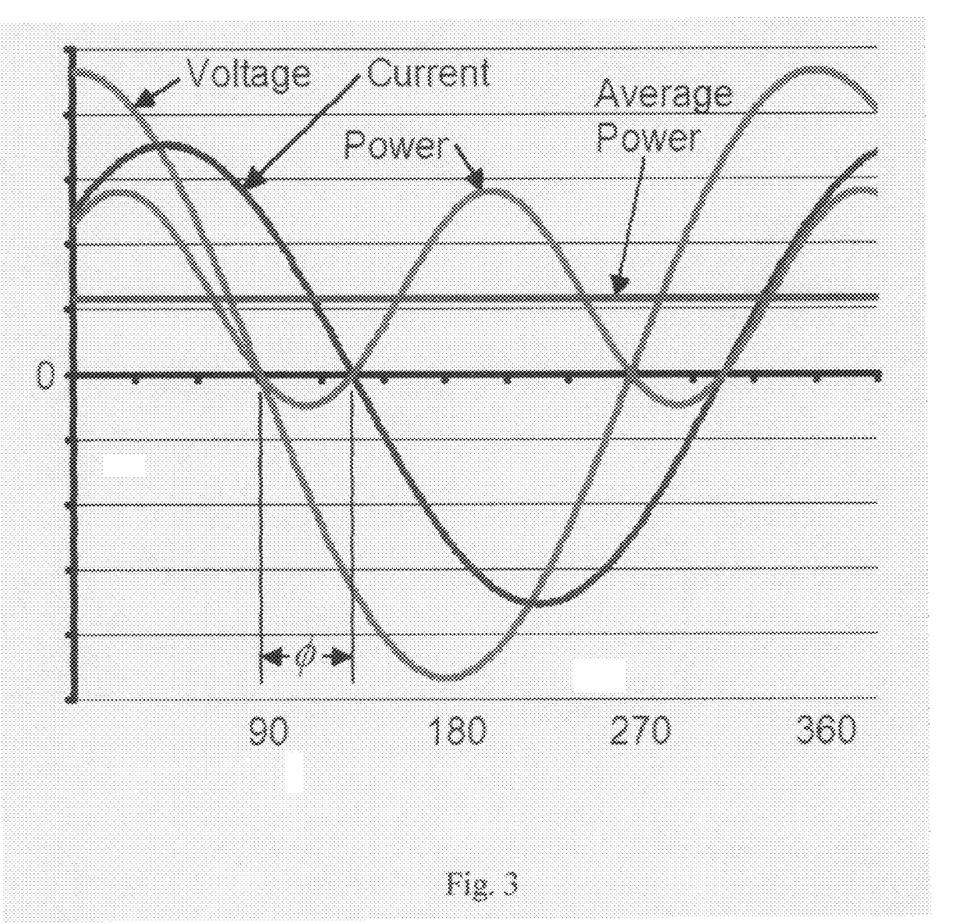
FIG. 3 shows a graph indicating phase separation φ.

Referring now to FIG. 3, a sinusoidal voltage waveform causes a resulting sinusoidal current waveform that is delayed by phase angle or separation φ. The power, which at any time is the product of voltage and current, is shown, as well as average power averaged over a cycle. For most systems, the phase angle or separation φ between a sinusoidal voltage waveform and its corresponding sinusoidal current waveform will be relatively small. For example, for a purely resistive circuit, there will be no phase separation, or 0°. Capacitors and inductors and other related devices can cause one of current or voltage to lag behind the other, causing a phase separation greater than 0°. In some cases, such as for a lightly loaded electric motor, the phase separation can be substantial, such as greater than 60°. Because in a three-phase system voltages are offset relative to each other by ⅓ cycle, or 120°, if a voltage waveform's corresponding current waveform lags by more than 60° (or more than half the distance between two adjacent voltage waveforms), it may become difficult to associate a current waveform with its voltage waveform, and thus to correctly determine the phase separation.

For voltage and/or current waveforms that are not sinusoidal, such as those containing harmonics, the phase separation φ can be determined by the distance between zero crossings (i.e., the points at which the waveforms cross zero). Ordinarily in AC systems, voltages cross zero relatively quickly (i.e., with a steep slope), and so zero crossings are well defined. However, in some cases, such as with electric light dimmers, the voltages remain at zero for more than an instant, such that zero crossings are not so well defined or determined, and different corresponding points (such as peaks, which are also difficult to determine) must be used to measure phase separation φ.

The power factor (PF) of a system can include either apparent power factor or displacement power factor, and can be calculated for sinusoidal waveforms as $\cos(\phi)$. In other words, for such waveforms, where $\phi<60°$, $PF>0.5$. Further, $PF=1$ when there is zero phase separation and $PF=0$ when power and current are 90° out of phase.

Apparent power factor is defined as the ratio of real power (P) to apparent power (S). Real power (P) is the power actually consumed by a load, often called KW (or kilowatts) or W (watts). The apparent power (S), often referred to as volt-amperes or VA, is the power that is actually sent by a generator to a load for potential consumption, even though some of that power, called reactive power (Q) (often referred to as voltamperes-reactive, or VAR), may "bounce" back and forth between the generator and load because it is 90° out of phase with the real power (P). (The charging and discharging of certain electronic elements, such as inductors and capacitors, requires power but does not consume it.) The displacement power factor is defined as $P/\sqrt{(P^2+Q^2)}$.

Large systems, such as the power delivered to a house or other building, usually have power factors substantially greater than 0.5 because appliances and other electrical devices having low power factors (less than 0.5) are often "buffered" by several other primarily resistive devices with high power factors.

Assuming that the present invention is being applied to relevant or large systems having phases with acceptably high power factors and small phase angle separations, there are at least two ways of determining whether or not an electrical meter is correctly wired to a system. First, for each phase, it can be determined whether the phase separation between the voltage waveform and its corresponding current waveform is not more than 60°, and/or whether the PF is not less than 0.5.

Figure 1:
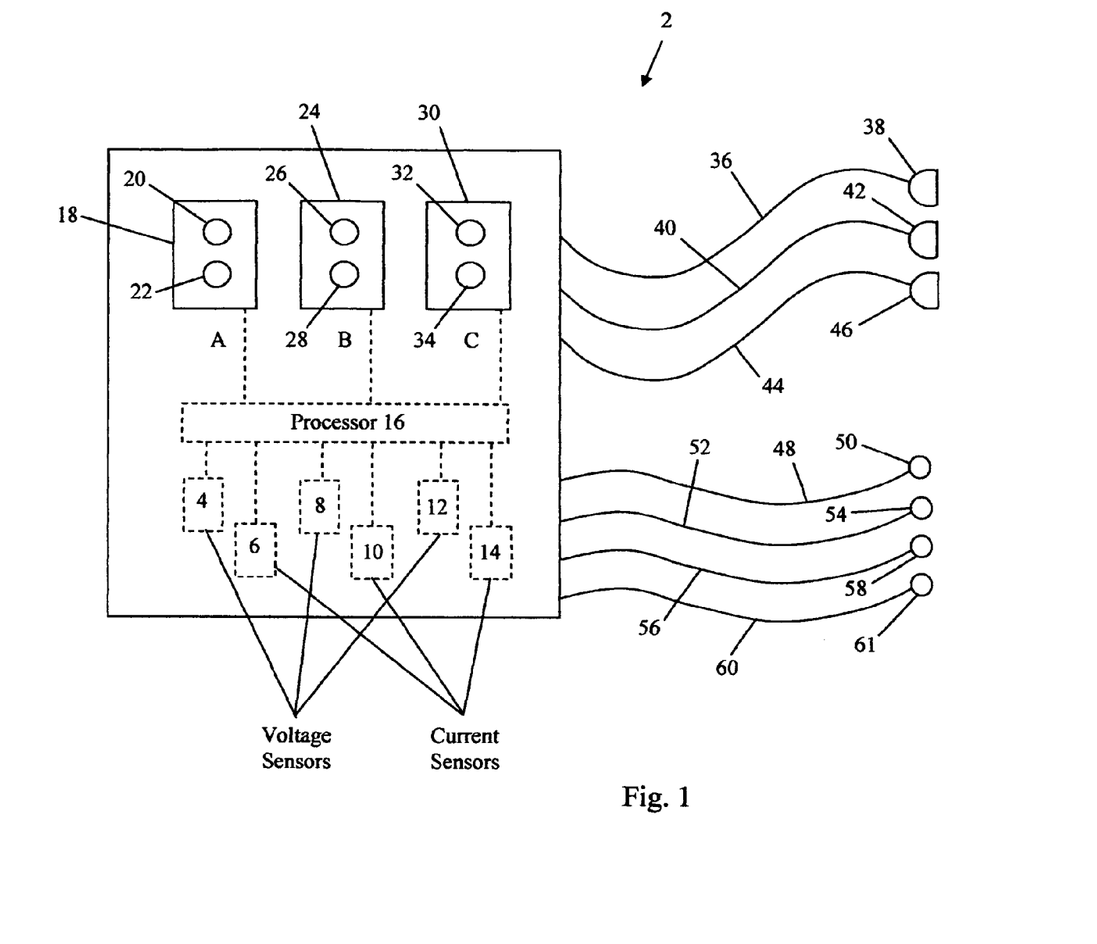
FIG. 1 shows a schematic view of an embodiment of the present invention.

Referring now to FIG. 1, an electrical phase checking apparatus 2 comprises a first voltage sensor 4, a first current sensor 6, a first binary indicator 18 corresponding to the first voltage and current sensors 4, 6, a second voltage sensor 8, a second current sensor 10, a second binary indicator 24 corresponding to the second voltage and current sensors 8, 10, a third voltage sensor 12, a third current sensor 14, a third binary indicator 30 corresponding to the third voltage and current sensors 12, 14, and a processor 16 connected to the sensors and indicators. The apparatus 2 may include, for each current sensor 6, 10, 14, a first, second, or third current probe 38, 42, 46 connected to its associated current sensor 6, 10, 14 via a corresponding wire 36, 40, 44. Further, the apparatus 2 may include, for each voltage sensor 4, 8, 12, a first, second, or third voltage probe 50, 54, 58 connected to its associated voltage sensor 4, 8, 12 via a corresponding wire 48, 52, 56. The apparatus 2 may include a neutral or ground voltage probe 61 and corresponding wire 60, connected to each voltage sensor 4, 8, 12, to provide a neutral reference to which a voltage measurement may be made.

The apparatus 2 may be a part of, or include, an electrical meter designed to calculate, display, record, etc., a variety of important electrical parameters, such as voltages, currents, power consumptions, energy consumptions, and so forth. Thus, of course, it is important to ensure that first voltage probe 38 is connected to or measuring the voltage of the same wire to which the first current probe 50 is connected or measuring the current, so that the power output calculated by the processor 16 by combining the voltage and current measurements from the first voltage and current sensors 4, 6 is correct. The same is true of the pair of second voltage and current probes 42, 54, as well as the pair of third voltage and current probes 46, 58.

The processor 16 (which may actually include a first, second, and third processor corresponding to each of the first, second, and third pairs of voltage and current sensors) may be configured to calculate or determine, for each pair of voltage and current sensors, a phase separation between the voltage waveform and the current waveform sensed by the corresponding pair of voltage and current sensors.

For example, the processor 16 may be configured (such as by loading appropriate software into it) to digitally sample voltages and to record an approximate point (such as time or portion of a cycle) of zero crossing, to digitally sample currents and to record an approximate corresponding point of zero crossing, to determine a distance or separation between these zero crossings, and, if necessary, to convert this separation to an angle. For example, if in a particular measurement, a voltage waveform was measured to cross zero volts at 21° (out of 360°) along a cycle, and the current waveform was measured to cross zero amperes at 36°, then a phase separation may be determined to be the 15°. Other methods of determining phase separation, such as measuring a distance between corresponding points (but not necessarily zero crossings) of the voltage and current waveforms, and any processor and/or software configured to determine phase separations between voltage and current waveforms, are within the scope of the present invention.

Alternatively or in addition, the processor 16 (which may actually include a first, second, and third processor corresponding to each of the first, second, and third pairs of voltage and current sensors) may be configured to calculate or determine, for each pair of voltage and current sensors, a power factor based at least in part on the voltage waveform and the current waveform sensed by the corresponding pair of voltage and current sensors.

For example, the processor 16 may be configured to digitally sample voltages and currents as measured by respective voltage and current sensors, and, for each sample, to multiply the measured voltage and current to obtain a real power. This power is then averaged over all sampled points throughout a complete cycle to arrive at the real power P. Then, because reactive power corresponds to power when current is shifted 90° out of phase with the measured current, the processor 16 may be configured to so shift the sampled current waveform and, for each sample, to multiply the measured voltage and shifted current to obtain a reactive power. This power is then averaged over all sampled points throughout a complete cycle to arrive at the reactive power Q. Finally, the processor 16 may be configured to calculated displacement power factor as $P/\sqrt{(P^2+Q^2)}$. Other methods of determining power factor, such as measuring apparent power S and calculating the ratio P/S, and any processor and/or software configured to determine power factor based at least in part on measured voltage and current waveforms, are within the scope of the present invention.

The processor 16 may further be configured to determine whether or not a determined or calculated parameter meets a predetermined criterion or value. For example, in the case of phase separation, the processor 16 may be configured to determine if the phase separation $\phi$ is not more than 60° (although in other embodiments this criterion or value may be 45° or 30°). If, for example, the phase separation $\phi$ between the voltage and current waveforms measured by the first voltage and current sensors 4, 6 is measured to be 25°, and the first value (i.e., the predetermined criterion applied to the voltage and current waveforms measured by the first voltage and current sensors 4, 6) is 60°, then the first binary indicator 18 will indicate that the first voltage and current probes 38, 50 are correctly connected (by indicating that the measured phase separation is not more than the first value).

As another example, in the case of power factor, the processor 16 may be configured to determine if the power factor is not less than 0.5 (although in other embodiments this criterion or value may be 0.6 or 0.7 or 0.8 or 0.9). If, for example, the power factor determined by the voltage and current waveforms measured by the first voltage and current sensors 4, 6 is 0.85, and the first value (i.e., the predetermined criterion applied to the voltage and current waveforms measured by the first voltage and current sensors 4, 6) is 0.5, then the first binary indicator 18 will indicate that the first voltage and current probes 38, 50 are correctly connected (by indicating that the measured power factor is not less than the first value).

The predetermined criterion or value for each of the phases may or may not be adjustable by a user of the invention.

Each binary indicator 18, 24, 30, as its name implies, is designed to have an on state and an off state, where the on state corresponds to an indication that the corresponding criterion or value is satisfied, and where the off state corresponds to an indication that the corresponding criterion or value is not satisfied. For example, in one embodiment, the first binary indicator 18 may be configured to be on only when the phase separation between the voltage and current waveforms measured by the first voltage and current sensors 4, 6 is not more than the first value, such as 45°. As another example, in one embodiment, the third binary indicator 30 may be configured to be on only when the power factor determined by the voltage and current waveforms measured by the third voltage and current sensors 12, 14 is not less than the third value, such as 0.7.

Each binary indicator 18, 24, 30 may have a "third" state (which is not really a state) in which it does not indicate whether or not the criterion or value is satisfied. For example, First binary indicator 18 may include a first light (such as a red light emitting diode, or LED) 20 and a second light (such as a green LED) 22 (and second binary indicator 24 may have corresponding lights 26, 28, and third binary indicator 30 may have corresponding lights 32, 34), whereby the off state is indicated by illumination of the first light 20 and the on state is indicated by illumination of the second light 22. Of course, if the apparatus 2 is powered off, then neither light 20, 22 will be illuminated, so that the apparatus 2 is not indicating whether or not the first value is satisfied. A feature of the present invention is the ease with which a user may determine whether or not a voltage probe is measuring the voltage of the same wire as a corresponding CT. Thus, each indicator should be binary.

Binary indicators 18, 24, 30 may comprise any indicator known in the art that has an easily ascertainable on state and off state, where the on state corresponds to an indication that the corresponding criterion or value is satisfied, and where the off state corresponds to an indication that the corresponding criterion or value is not satisfied. To provide examples but not limitations, each binary indicator may comprise: a single light bulb, LED, or other light-emitting device, where on corresponds to the on state, and off corresponds to the off state; a single light bulb, LED, or other light-emitting device capable of being illuminated in two colors (or in more than two colors but programmed by processor 16 to illuminate in only two colors), where each color corresponds to one of the on and off states; a single light bulb, LED, or other light-emitting device, programmed by processor 16 to illuminate at two intensities, each intensity corresponding to one of the on and off states; a strobe light programmed by processor 16 to flash or strobe at two different rates or frequencies, each rate corresponding to one of the on and off states; a speaker programmed by processor 16 to emit a first sound (such as a first pitch or first amplitude), where the on state corresponds to emission of the first sound, and the off state corresponds to the lack of sound emission; a speaker programmed by processor 16 to emit a first sound and a second sound, different in some aspect (such as pitch, amplitude, etc.), where each sound corresponds to one of the on and off states; and so forth. Of course, the present invention is not limited to indicators that indicate via light bulbs, speakers, light, sound, etc., and any indicator that provides a binary indication to a user via one of her five senses is within the scope of the present application.

Of course, any of the above descriptions could include the phrase "or vice versa." For example, in the case of the single LED, on (or illumination) may corresponds to the off state, and off (or lack of illumination) could correspond to the on state, and so forth. Further, the word "indicating" can include situations in which a user is informed via the lack of illumination of an LED, sound emission from a speaker, etc. For example, a binary indicator may include only a red LED, which may be illuminated to indicate when a corresponding criterion or value is not satisfied, and extinguished when it is satisfied.

Figure 2:
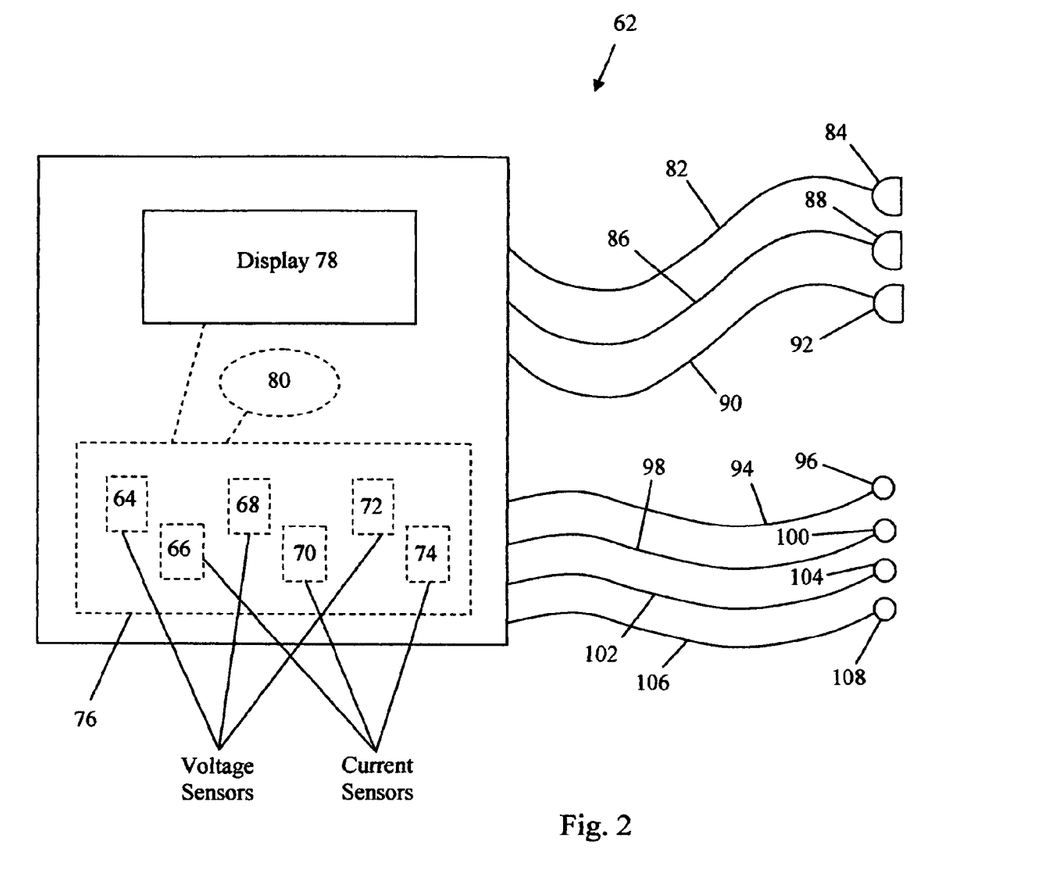
FIG. 2 shows a schematic view of an embodiment of the present invention.

Referring now to FIG. 2, an electrical phase checking apparatus 62 comprises a first voltage sensor 64, a first current sensor 66, a second voltage sensor 68, a second current sensor 70, a third voltage sensor 72, a third current sensor 74, a processor 76 (which may include first, second, and third processors corresponding to each of the three pairs of voltage and current sensors), a display 78, and a sound-producing device or speaker 80. First, second, and third current probes 84, 88, 92, are connected to corresponding first, second, and third current sensors 66, 70, 74 via respective wires 82, 86, 90. First, second, and third voltage probes 96, 100, 104 are connected to corresponding first, second, and third voltage sensors 64, 68, 72 via respective wires 94, 98, 102. Neutral voltage probe 108 is connected to each of the voltage sensors via wire 106. The display 78 may be used to display information measured and/or calculated by the sensors and/or processor 76, such as real, apparent, or reactive power, energy, voltage, current, resistance, impedance, or any other useful information.

In FIG. 2, the voltage and current sensors are shown as part of the larger processor 76, which may include the sensors, software, hardware, and such, required to sense, record, and/or analyze voltage and current information obtained via the voltage and current probes. The processor 76 may also be configured or programmed to cause the speaker 80 to indicate whether or not at least one of the criteria or values is satisfied.

The binary indicators may be consolidated into fewer than those shown, such as one-however, this indicator must still be binary. For example; a single speaker 80 that is a binary indicator may serve as the first, second, and third binary indicators as shown in the embodiment in FIG. 2, described as follows. First voltage and current probes 96, 84 may be connected to wires in an electrical system. The apparatus 62 may be configured to emit sound from the speaker 80 (such as a buzzing noise) only when the first value is not satisfied (such as if the phase separation is greater than 60° or the power factor is less than 0.5). If a user then hears the buzzing noise, it is an indication to him that the probes are not connected properly, and he may then remove one of the probes and re-connect the probe to a different wire. He may repeat this process until he fails to hear (or the speaker 80 fails to emit) the buzzing noise. Then, he may proceed to connect the second voltage and current probes 100, 88 to other wires in the system and listen for a sound emitted by speaker 80. Again, the speaker 80 is still serving as a binary indicator, this time indicating whether or not the second criterion or value is satisfied. The process continues until all probes are properly connected because they satisfy their respective criteria or values.

Figure 4:
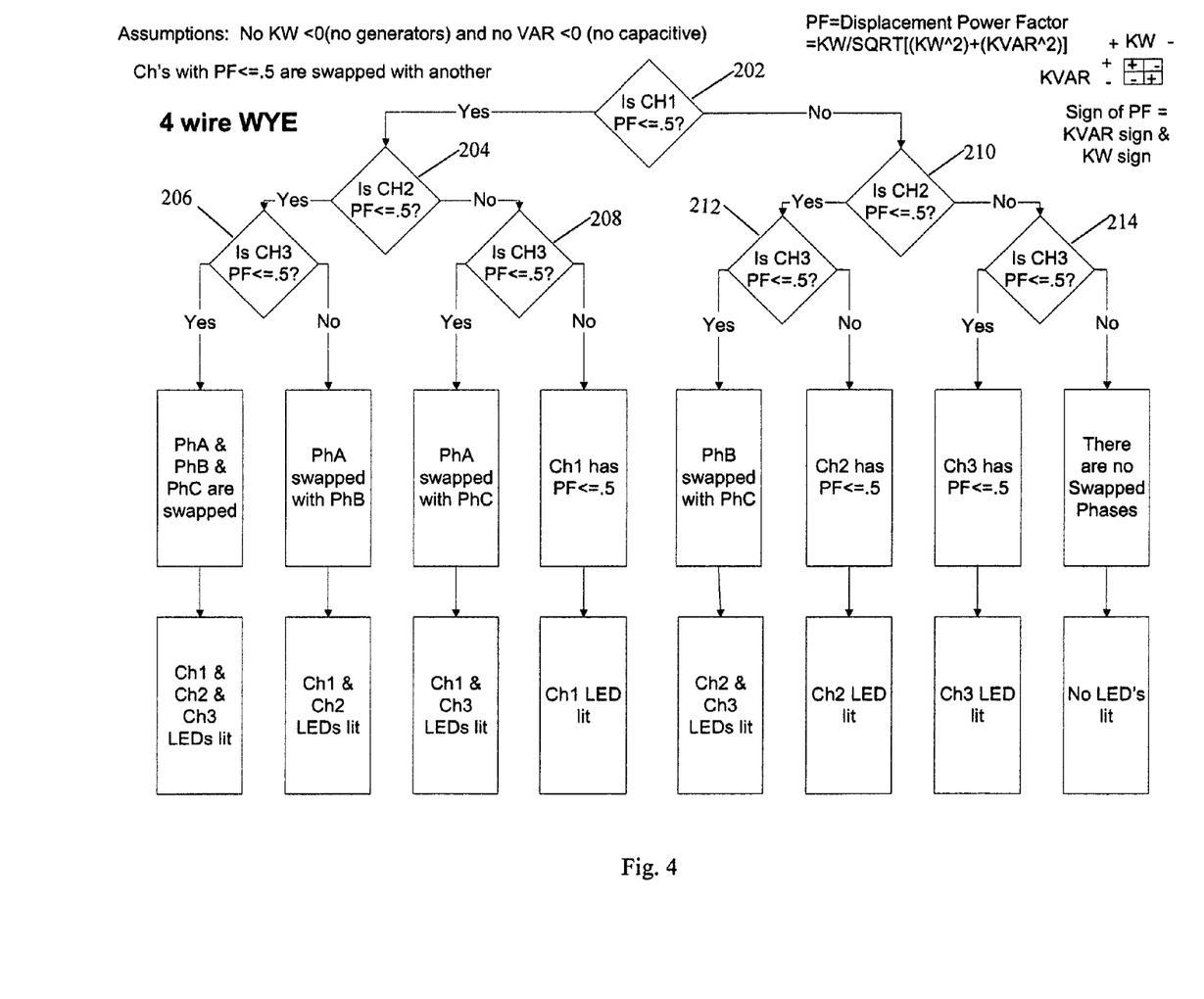
FIG. 4 shows a decision tree of a method according to an embodiment of the present invention.

Referring now to FIG. 4, a decision tree that may be implemented by a user of the present invention is shown, where the apparatus 2 is configured to calculate power factor. In decision 202, the apparatus 2 determines whether the power factor calculated by first voltage and current sensors 4, 6 (corresponding to a first channel or Channel 1 (CH1)) is less than 0.5, and indicates appropriately to the user via the first binary indicator 18. In decisions 204 and 210, the apparatus 2 determines whether the power factor calculated by second voltage and current sensors 8, 10 (corresponding to a second channel or Channel 2 (CH2)) is less than 0.5, and indicates appropriately to the user via the second binary indicator 24. In decisions 206, 208, 212, 214, the apparatus 2 determines whether the power factor calculated by third voltage and current sensors 12, 14 (corresponding to a third channel or Channel 3 (CH3)) is less than 0.5, and indicates appropriately to the user via the third binary indicator 30. The user can then use the decision tree shown in FIG. 4 to determine whether his probes are connected properly, and, if not, what is wrong. For example, if at decision 202 the apparatus 2 indicates to the user that the power factor of CH1 is less than 0.5, if at decision 204 the apparatus 2 indicates to the user that the power factor of CH2 is less than 0.5, and if at decision 206 the apparatus 2 indicates to the user that the power factor of CH3 is not less than 0.5 (perhaps, in one embodiment, because only CH1 and CH2 LEDs are lit), then the user can determine that the voltage or current probes measuring first and second phases (PhA and PhB, respectively) are swapped. He may remedy this situation then by swapping the first and second voltage probes 96, 100, or swapping the first and second current probes 84, 88.

Figure 5:
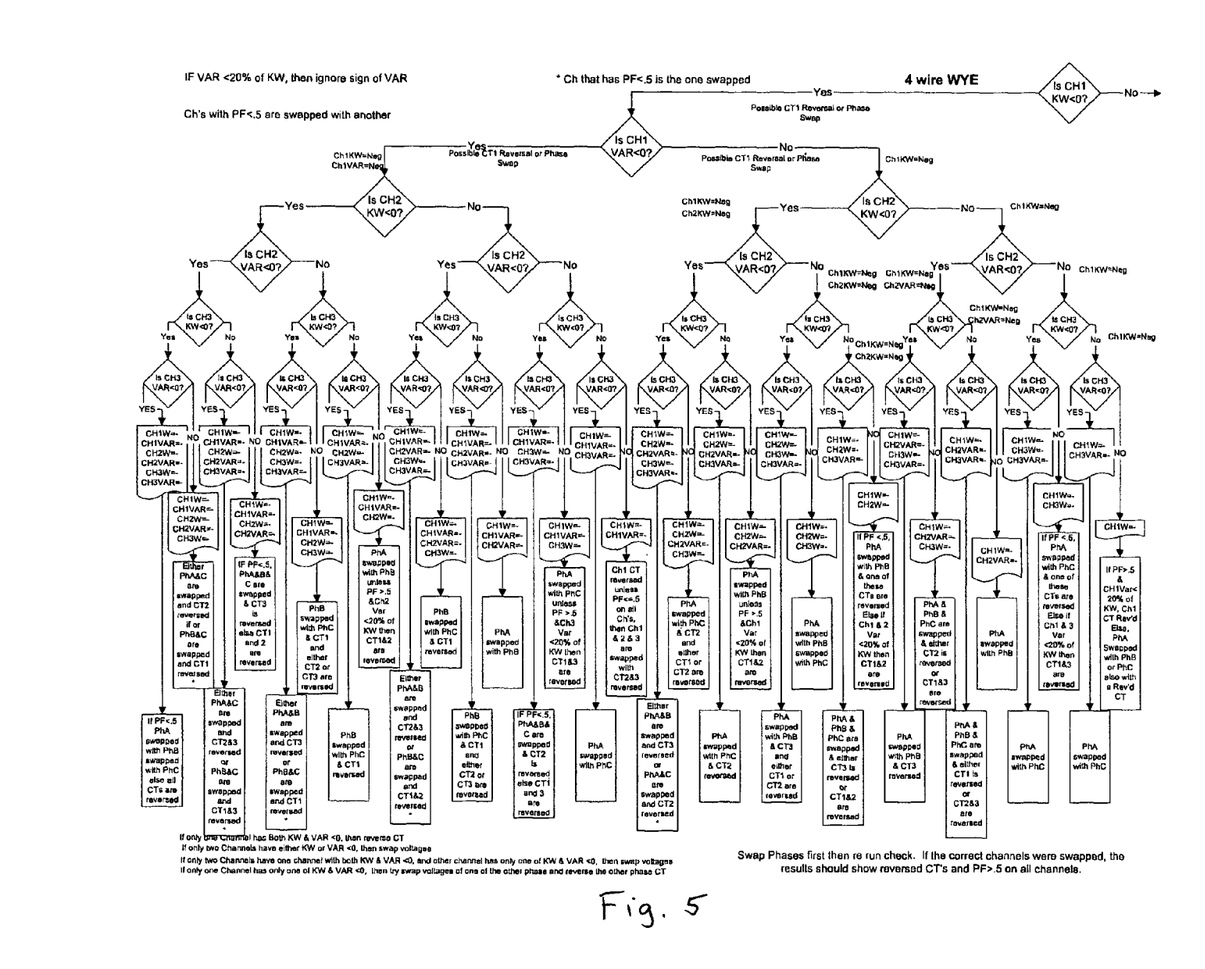
FIG. 5 shows a decision tree of a method according to an embodiment of the present invention.

FIG. 5 shows a decision tree that may be implemented by the user of an apparatus (not shown) that is capable of indicating to a user whether or not he has properly connected probes to a system in which real power consumption may be negative (KW<0) (e.g., because of inclusion of electrical generators). Using the decision tree, he may be able to fix any errors in probe connection necessary before proper metering is possible.

Most of the embodiments described herein have represented simple versions for clarity of explanation. As understood by one of ordinary skill in the art, many of the features and/or aspects of the embodiments described herein may be "mixed and matched" to the extent physically possible to satisfy individual design requirements. Further, variations on the above discussed embodiments are within the scope of the present invention. As one example, any of the apparatuses described herein may be applicable to a two-phase system, a three-phase delta system, and so forth. For example, the present invention may include an apparatus that includes only two sets of voltage sensors, current sensors, and binary indicators (and/or processors), with three voltage probes (one as a neutral) and two current probes. As another example, the apparatus 2 shown in FIG. 1 may be a complete electrical meter, such as a multimeter, that includes the display 78 shown in FIG. 2, and so forth.

I claim:

1. A method of metering an electrical characteristic of a system, comprising in the following order:
    a) providing an electrical phase checking apparatus, the electrical phase checking apparatus comprising:
        a first voltage sensor;
        a first current sensor;
        a first binary indicator connected to said first voltage sensor and first current sensor, said first binary indicator configured to indicate when a phase separation between a voltage waveform measured by said first voltage sensor and a current waveform measured by said first current sensor is not more than a first value;
        a second voltage sensor;
        a second current sensor; and
        a second binary indicator connected to said second voltage sensor and second current sensor, said second binary indicator configured to indicate when a phase separation between a voltage waveform measured by said second voltage sensor and a current waveform measured by said second current sensor is not more than a second value, wherein the apparatus further comprises a first voltage probe connected to the first voltage sensor, a first current probe connected to the first current sensor, a second voltage probe connected to the second voltage sensor, and a second current probe connected to the second current sensor;
    b) attaching at least two of said probes to at least one wire in said system;
    c) reading a binary indication output by at least one of said binary indicators; and
    d) detaching at least one of said at least two of said probes and attaching it to a different wire in said system in response to said reading.

2. The method as claimed in claim 1, wherein the electrical phase checking apparatus further comprises:
    a third voltage sensor;
    a third current sensor; and
    a third binary indicator connected to said third voltage sensor and third current sensor, said third binary indicator configured to indicate when a phase separation between a voltage waveform measured by said third voltage sensor and a current waveform measured by said third current sensor is not more than a third value.

3. The method as claimed in claim 2,
    wherein said first, second, and third values are not more than 60°, and
    wherein at least one of said first, second, and third binary indicators comprises at least one of a light and a sound-producing device.

4. The method as claimed in claim 3, wherein said first, second, and third binary indicators each comprises a red light-emitting diode and a green light-emitting diode.

5. The method as claimed in claim 1, wherein said first and second values are not more than 60°.

6. The method as claimed in claim 1, wherein at least one of said first and second binary indicators comprises a light.

7. The method as claimed in claim 1, wherein the electrical phase checking apparatus further comprises:
    a third voltage sensor;
    a third voltage probe connected to the third voltage sensor;
    a third current sensor;
    a third current probe connected to the third current sensor; and
    a third binary indicator connected to said third voltage sensor and third current sensor, said third binary indicator configured to indicate when a phase separation between a voltage waveform measured by said third voltage sensor and a current waveform measured by said third current sensor is not more than a third value.

8. The method as claimed in claim 1, wherein said first and second values are not more than 60°.

9. The method as claimed in claim 1, wherein said reading comprises viewing a binary light output.

10. A method of metering an electrical characteristic of a system, comprising in the following order:
    a) providing an electrical phase checking apparatus, the electrical phase checking apparatus comprising:
        a first voltage sensor;
        a first current sensor;
        a first processor configured to determine a first power factor based at least in part on a voltage waveform measured by said first voltage sensor and a current waveform measured by said first current sensor;
        a first binary indicator connected to said first processor and configured to indicate when said first power factor is not less than a first value;
        a second voltage sensor;

a second current sensor;

a second processor configured to determine a second power factor based at least in part on a voltage waveform measured by said second voltage sensor and a current waveform measured by said second current sensor; and a second binary indicator connected to said second processor and configured to indicate when said second power factor is not less than a second value, wherein the apparatus further comprises a first voltage probe connected to the first voltage sensor, a first current probe connected to the first current sensor, a second voltage probe connected to the second voltage sensor, and a second current probe connected to the second current sensor;

b) attaching at least two of said probes to at least one wire in said system;

c) reading a binary indication output by at least one of said binary indicators; and d) detaching at least one of said at least two of said probes and attaching it to a different wire in said system in response to said reading.

11. The method as claimed in claim 10, wherein the electrical phase checking apparatus further comprises:

a third voltage sensor;

a third current sensor;

a third processor configured to determine a third power factor based at least in part on a voltage waveform measured by said third voltage sensor and a current waveform measured by said third current sensor; and a third binary indicator connected to said third processor and configured to indicate when said third power factor is not less than a third value.

12. The method as claimed in claim 11, wherein said first, second, and third values are not less than 0.5, and wherein at least one of said first, second, and third binary indicators comprises at least one of a light and a sound-producing device.

13. The method as claimed in claim 12, wherein said first, second, and third binary indicators each comprises a red light-emitting diode and a green light-emitting diode.

14. The method as claimed in claim 10, wherein said first and second values are not less than 0.5.

15. The method as claimed in claim 10, wherein at least one of said first and second binary indicators comprises a light.

16. The method as claimed in claim 10, wherein the electrical phase checking apparatus further comprises:

a third voltage sensor;

a third voltage probe connected to the third voltage sensor;

a third current sensor;

a third current probe connected to the third current sensor a third processor configured to determine a third power factor based at least in part on a voltage waveform measured by said third voltage sensor and a current waveform measured by said third current sensor; and a third binary indicator connected to said third processor and configured to indicate when said third power factor is not less than a third value.

17. The method as claimed in 10, wherein said first and second values are not less than 0.5.

18. The method as claimed in claim 10, wherein said reading comprises viewing a binary light output.

\* \* \* \* \*